United States Patent
Kaji et al.

(10) Patent No.: US 7,084,077 B2
(45) Date of Patent: Aug. 1, 2006

(54) METHOD OF FABRICATING MULTILAYER INTERCONNECT WIRING STRUCTURE HAVING LOW DIELECTRIC CONSTANT INSULATOR FILM WITH ENHANCED ADHESIVITY

(75) Inventors: Naruhiko Kaji, Kamakura (JP); Katsumi Yoneda, Kokubunji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/927,123

(22) Filed: Aug. 27, 2004

(65) Prior Publication Data
US 2005/0085097 A1    Apr. 21, 2005

(30) Foreign Application Priority Data
Aug. 28, 2003    (JP) ............................. 2003-305063

(51) Int. Cl.
*H01L 21/26* (2006.01)
*H01L 21/42* (2006.01)
*H01L 21/324* (2006.01)

(52) U.S. Cl. ................ 438/780; 438/781; 257/E21.576

(58) Field of Classification Search ................ 438/780, 438/781, 783; 257/E21.576
See application file for complete search history.

(56) References Cited

U.S. PATENT DOCUMENTS
6,218,299 B1 *    4/2001    Akahori et al. ............. 438/682

FOREIGN PATENT DOCUMENTS
JP    2004-111688    4/2004

* cited by examiner

*Primary Examiner*—Caridad Everhart
(74) *Attorney, Agent, or Firm*—Oblon, Spivak, McClelland, Maier & Neustadt, P.C.

(57) ABSTRACT

A method for fabricating a high density semiconductor integrated circuit device with a multilayer interconnect wiring structure is disclosed. This structure has a low-dielectric constant insulator film including an organic thin-film with its dielectric constant ranging from about 2.0 to about 2.4. To fabricate the multilayer wiring structure, a substrate with an inorganic film for use as an underlayer dielectric film is prepared. Then, apply plasma processing, such as plasma-assisted chemical vapor-phase growth, to a top surface of the inorganic underlayer dielectric film in environment that contains therein organic silane-based chemical compounds, thereby to form on the inorganic film surface a hydrophobic surface layer with a contact angle with water being 50° or higher. Next, form on the plasma-processed hydrophobic surface an organic film including a fluorinated aromatic carbon hydride polymer film. The resulting adhesion between the stacked inorganic and organic films is thus enhanced while at the same time reducing or minimizing electrical resistivity and capacitance of the multilayer structure.

24 Claims, 5 Drawing Sheets

METHOD OF FABRICATING MULTILAYER INTERCONNECT WIRING STRUCTURE HAVING LOW DIELECTRIC CONSTANT INSULATOR FILM WITH ENHANCED ADHESIVITY

CROSS-REFERENCE TO RELATED APPLICATION(S)

This application claims the priority of Japanese Patent Application Ser. No. 2003-305063, filed Aug. 28, 2003, the entire disclosure of which is incorporated herein by reference.

TECHNICAL FIELD

The present invention relates to methodology of making electronic devices. More particularly but not exclusively, this invention relates to a method for fabricating a semiconductor device using a low dielectric constant film for forming a multilayer interconnect wiring structure of low electrical resistivity and low capacitance. The invention also relates to multilayer interconnect wiring structures with increased adhesivity for use in ultra-large scale integrated circuit (ULSI) chips.

BACKGROUND OF THE INVENTION

As semiconductor integrated circuit (IC) devices decrease in size, problems arise as to an increase in electrical resistance of on-chip interconnect wiring lines and an increase in capacitance between wires and between wiring layers. The increases in wire resistivity and in capacitance would result in occurrence of signal transmission delays, which in turn results in a decrease in operating speeds. Thus, remedies for avoiding such problems are under consideration. As one of such remedial measures, an attempt is made to use certain films with low dielectric constants as interlayer dielectric (ILD) insulating films to thereby lower the resistance and capacitance values.

Low dielectric constant films for use as ILD films include a carbon-doped silicon oxide (SiOC) film made of an inorganic material with methyl groups introduced into silicon dioxide ($SiO_2$) and an organic film made of polyallylether derivative or the like, although these materials are in the phase of development. These thin-films are typically 2.6 to 2.9 in dielectric constant. The dielectric constant values remain deficient in view of the quest for highly advanced semiconductor device technologies. Challenges are being made to further reduce the dielectric constant for adaptation to electronic devices of the next generation. One approach to attaining an ultra-low dielectric constant is to introduce holes into an ILD film for reduction of the film density, thereby achieving a film with its dielectric constant ranging from 2.0 to 2.4 in value.

Unfortunately, the advantage of the pore introduction technique does not come without accompanying risks and penalties which follow. When introducing pores into a film, the resulting film decreases in mechanical strength. Such film strength reduction causes a film which is formed on or above a substrate during manufacturing processes to become readily crackable. The film strength reduction also results in a decrease in film properties occurring due to the presence of gas components being absorbed in the pores and/or chemical agents residing therein. This requires execution of additional post-processing for curing any possible deterioration. Due to these penalties, it has been difficult to apply the film having these holes to semiconductor device fabrication processes.

A currently studied alternative approach to achieving the film with its dielectric constant of 2.0 to 2.4 is to lower the dielectric constant of the film-constituting material per se, rather than lowering the dielectric constant by introduction of pores thereinto. One known film that is deemed to satisfy this specification is a fluorinated aromatic-series carbon hydride polymeric film. However, this film is faced with a problem as to occurrence of defects and failures during manufacturing processes. More specifically, the film inherently has fluorine atoms therein and, for the very reason, stays less in adhesion with inorganic films made of silicon dioxide ($SiO_2$), silicon nitride (SiN), silicon carbide (SiC) or else.

As apparent from the foregoing, when using an organic dielectric material film such as the one that is made of fluorinated aromatic-series carbon hydride polymer material, currently available organic dielectric films are less in adhesion at the interface with an inorganic film or a metallic film. This poses a problem that unwanted peel-off or "abruption" defects can readily take place. One known approach to mitigating this problem is disclosed, for example, in Japanese Laid-Open Patent Application No. 2000-183052 ("JP-A-2000-183052"). The technique as taught thereby is to improve the film adhesion by use of a method that has the steps of forming dangling bonds on a substrate surface to be processed and then forming on the surface an organic dielectric material film. The dangling bonds are formed either by performing reverse sputtering of the substrate surface being processed or by forming a layer that contains an increased number of silicon atoms—namely, "Si-rich" layer—in the light of stoichiometry composition.

With this method as taught by JP-A-2000-183052, it is considered that the adhesion is improved while reducing the risk of peel-off occurrence without having to take any particular corrective measures, when compared to the case of mere lamination or "multilayer" of an organic dielectric material film on the substrate being processed. However, this method still fails to provide an intended film with its adhesion large enough to meet the requirements in advanced semiconductor device microfabrication process technologies in recent years. This can be said because the method is incapable of fully removing thermal and physical stresses occurring at an interface between multilayered films. More specifically, the method is designed to directly form dangling bonds on the substrate surface under processing to thereby enhance the adhesion with an organic dielectric material film to be later formed on the surface. The interface is between the inorganic film and the organic dielectric film that is in tight contact with the surface of such inorganic film. In other words, two layers of films are directly adhered together, which are significantly different in characteristics from each other. This characteristics difference causes the interface to suffer from unwanted application of thermal and physical stresses, which leads to the deficiency of interlayer adhesion. Thus a need is felt to provide a technique for enabling achievement of further enhanced adhesivity between organic and inorganic films in highly integrated multilayer semiconductor device structures.

SUMMARY OF THE INVENTION

It is therefore an object of the present invention to avoid or mitigate the above-noted problems faced with the prior art.

It is another object of this invention to provide a new and improved method of making an electronic device including a multilayer structure having a low-dielectric constant insulative film with increased adhesion.

It is a further object of the invention to provide methodology capable of avoiding occurrence of manufacturing failures or defects, such as unwanted removal or peel-off of a film during fabrication of an electronic device that has a low dielectric constant ILD film including an organic thin-film with its relative dielectric constant ranging from 2.0 to 2.4.

To attain the foregoing objects, the invention provides an electronic device fabrication method which at least includes the steps of applying plasma processing to the surface of an inorganic film in an environment containing therein an organic silane-based chemical compound to thereby form at the inorganic film surface a hydrophobic surface with a contact angle with water being 50 degrees (°) or greater. The method also includes the step of forming at the plasma-processed surface a fluorinated aromatic carbon hydride polymeric film.

These and other objects, features and advantages of the invention will be apparent from the following more particular description of presently preferred embodiments of the invention, as illustrated in the accompanying drawings.

DETAILED DESCRIPTION OF THE INVENTION

A semiconductor integrated circuit (IC) device fabricating method in accordance with an illustrative embodiment of this invention will be explained with reference to FIG. 1 and FIGS. 2A to 2E, which show some major process steps thereof (not drawn to scale).

Figure 1:
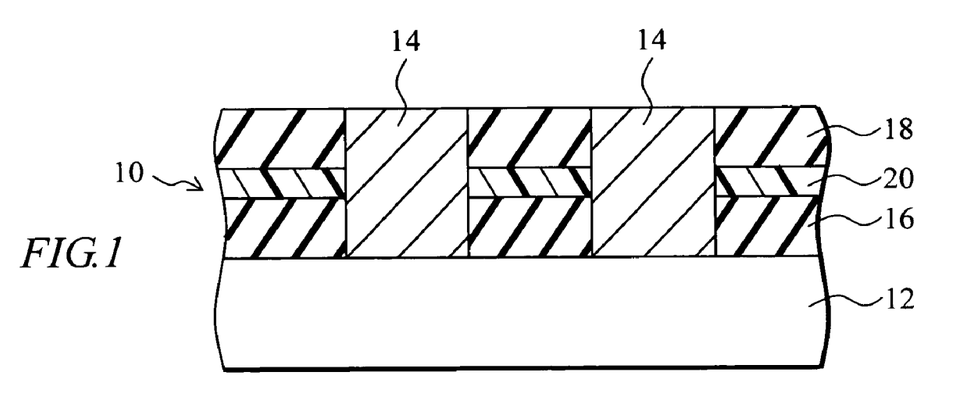
FIG. 1 depicts a cross-sectional view of main part of a semiconductor IC device having a multilayer interconnect wiring structure embodying the principles of the present invention.

Principally, this embodiment is aimed at achievement of a multilayer interconnect wiring structure 10 shown in FIG. 1. This structure 10 has on a wafer substrate 12 a patterned layer of on-chip interconnect wires 14. These wires 14 is electrically insulated by a multilayer dielectric insulator that includes an underlying inorganic film 16 and its overlying organic film 18 of a low dielectric constant, which structure offers enhanced adhesivity therebetween. To this end, when forming the low-dielectric constant organic film 18 above the inorganic underlayer film 16, let these films be multi-layered with a hydrophobic surface layer 20 being interposed or "sandwiched" therebetween.

Figure 2A:
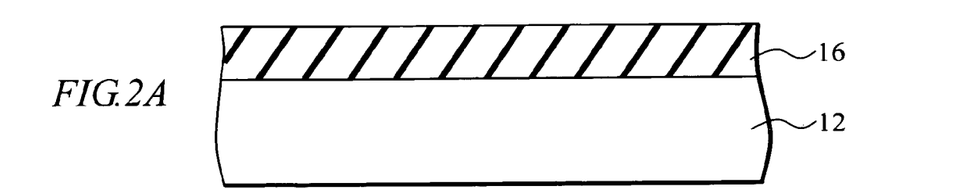
FIGS. 2A through 2E illustrates, in cross-section, some of the major process steps in the manufacture of a semiconductor IC device in accordance with one embodiment of this invention.

A process of fabricating the low-dielectric constant multilayer wiring structure 10 of FIG. 1 will be set forth with reference to FIGS. 2A to 2E. Firstly, as shown in FIG. 2A, there is prepared a starting substrate 12 having its top surface with an inorganic underlayer film 16 formed thereon. The substrate 12 may be a semiconductor substrate made of silicon, for example. The underlayer film 16 is typically implemented as one of inorganic films made of silicon carbide (SiC), silicon carbon nitride or "cyanide" (SiCN), silicon nitride (SiN), silicon dioxide ($SiO_2$), silicon oxynitride (SiON) and carbon-doped silicon oxide (SiOC), also known as silicon oxycarbide. The film 16 may be a sole film of any one of these materials. Optionally, this inorganic thin-film 16 may be a film that is formed by plasma-assisted chemical vapor deposition (PACVD), also called plasma-enhanced CVD in some cases.

Figure 2B:
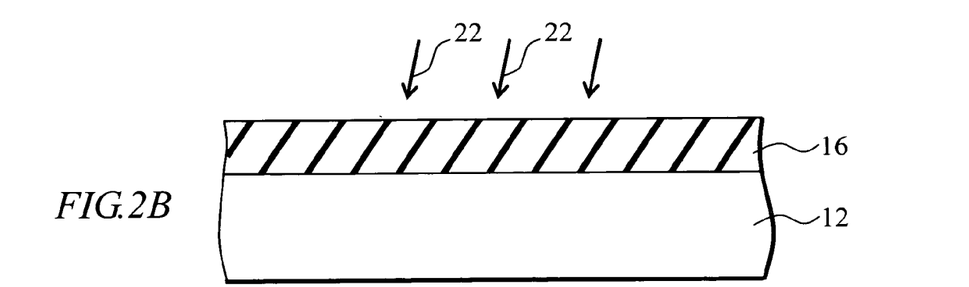
Figure 2C:
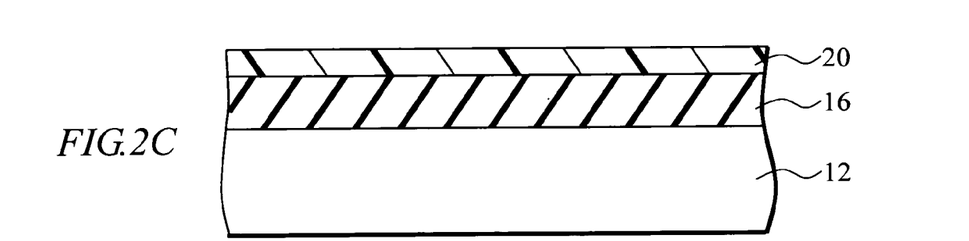

Next, as shown in FIG. 2B, the surface of the inorganic underlayer film 16 is subjected to plasma processing in the presence of organic silane-based chemical compounds. The plasma processing results in organic silicon-based compounds being added to the surface of the inorganic underlayer film 16 as indicated by arrows 22 in FIG. 2B. Whereby, the inorganic underlayer film 16's surface becomes a hydrophobic surface layer 20 with less wettability as shown in FIG. 2C.

Preferably the degree of the hydrophobic property or "hydrophobicity" of the above-noted surface layer 16 is such that the contact angle of this surface with water is greater than or equal to 50°. More preferably, the contact angle is set at 60° or more. In cases where the water contact angle of this surface layer 20 is less than 50°, the resulting adhesion with an organic low-dielectric constant film (denoted by numeral 18 in FIG. 1) to be formed on its surface at a later process step stays inferior. This causes the organic low-dielectric constant film to peel off in the manufacture of a semiconductor IC chip using the same, resulting in a likewise decrease in manufacturing yields. To measure the water contact angle of the inorganic film 16, place the substrate 12 with inorganic film 16 on a horizontal plane, and let pure water drop down onto a cleaned surface of the inorganic film 16, followed by measurement of an angle defined between the inorganic film 16 and water at a portion whereat inorganic film 16 is in contact with drops of water.

An approach to controlling the water contact angle of the inorganic film 16 so that this angle falls within the above-noted specific range is to appropriately choose the organic silicon-based compound to be used and/or to control the length of a time period for plasma processing to thereby control the thickness of a film thus formed. With the technique(s), it is possible to force the inorganic-film/water contact angle to stay within the range required.

More practically, employ an organic silane-based compound having nonpolar organic groups, and then apply thereto plasma processing for more than five (5) seconds. With this process, it is possible to fabricate the intended hydrophobic film 20 with its contact angle falling within the above-noted range.

The organic silane-based compound as used in the step shown in FIG. 2B may be organic compounds with silicon atoms bonded with alkyl groups and/or alkoxy groups. Examples thereof are tetramethylsilane, trimethylsilane, dimethylsilane, tetraethylsilane, tetraethoxysilane and other similar suitable materials. These compounds are usable individually or in mixture. In this process, the ambient environment for use with the plasma processing may be an atmosphere consisting essentially of a gas of the above-noted organic silane-based compound only or alternatively may be an atmosphere with a diluent gas added to the organic silane-based compound gas. This diluent gas is typically implemented as a rare gas of helium, xenon, neon or else, although it is replaceable with a nitrogen gas when the need arises. In the case of using rare gases, the organic silane-based compound preferably ranges in content from 10 to 100 volume percent (%).

Figure 3:
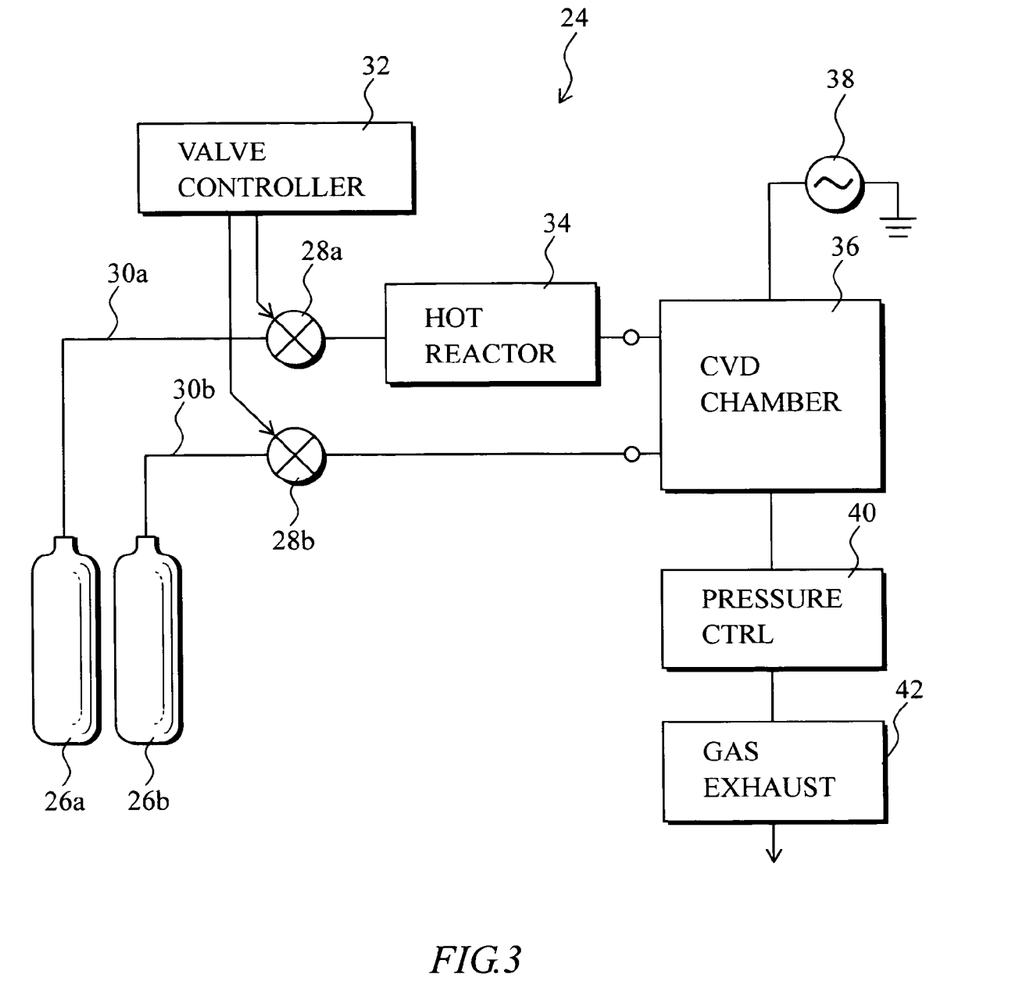
FIG. 3 is a diagram schematically depicting a configuration of a plasma-assisted CVD processing apparatus adaptable for use with the method embodying the invention.

For this plasma processing step of FIG. 2B, a plasma processing apparatus 24 shown in FIG. 3 is employable. In FIG. 3, raw material-containing vessels 26a and 26b are the containers which contain therein various kinds of raw gases to be used in this plasma processor equipment 24. Typically these containers 26a–26b are implemented as high-pressure gas cylinders or "bombs." These high-pressure gas bombs 26a–26b are such that a different one is used per raw material species. The illustrative gas bombs 26a–b are arranged to supply raw gases therefrom to flow-rate control devices 28a and 28b by way of corresponding pipes 30a–30b associated therewith. Preferably the flow rate controllers 28a–28b are valves that are controlled in raw gas delivery amounts by a control device 32.

Raw gases are introduced from the flow rate controllers 28a–28b are then supplied through a heating reaction or "hot reactor" mechanism 34 and also via a piping route that is coupled to a film-forming chamber 36, in case a need is felt to preheat such raw gases in a way depending upon the form of plasma-assisted CVD processing required. On the other hand, when supplying raw gases to the film formation chamber 36 without having to apply no processing to the raw gases, these gases are directly supplied to the film formation chamber 36 via pipes coupled to this chamber 36 without passing through such the hot reactor mechanism 34. Although a detailed explanation of the film formation chamber 36 is eliminated herein, this chamber is arranged to include therein a member for permitting placement of the substrate 12 to be processed, called the "susceptor" among skilled persons in the semiconductor device art. A heater module (not shown) is provided in close proximity to this susceptor to thereby enable heating of the to-be-processed substrate 12 being presently mounted on the susceptor. Additionally, a high-frequency or radio frequency (RF) power supply unit 38 is connected to the film formation chamber 36, for generating a plasma at or near the surface that is in contact with the to-be-processed substrate 12 being mounted on the susceptor. Additionally a pressure control device 40 is also connected to this film formation chamber 36, thus providing adjustability of the pressure within the film formation chamber 36. And, a gas exhaust device 42 is connected to this pressure control device 40, for enabling appropriate discharge or evacuation of gases such as unreacted gas components of the plasma processing to be exhausted from inside of the film formation chamber 36 and also gases yielded therein.

In this process, the plasma processing to be done using the above-noted apparatus 24 may be carried out under the conditions which follow:

Heater Temperature: 250 to 400° C.
Inactive Gas Flow Rate: 0 to 2000 sccm
Chamber Inside Pressure: 100 to 500 Pa
RF Output: 200 to 1500 W
Processing Time: 3 to 10 seconds Then, as shown in FIG. 2D, an organic film 18 with a low dielectric constant is formed on the hydrophobic surface 20 of the inorganic underlayer film 16, which has been processed to exhibit hydrophobicity in the preceding step of FIG. 2C.

Figure 2D:
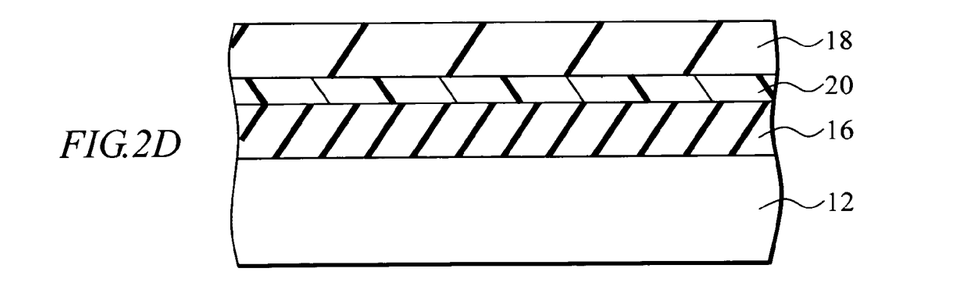
Figure 2E:
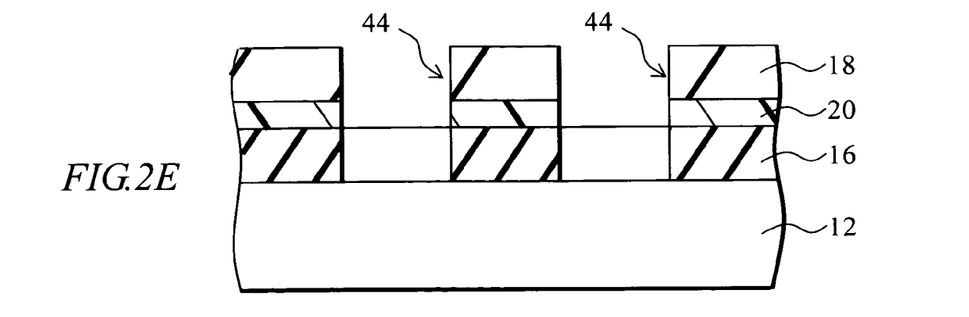

Next, as shown in FIG. 2E, the structure of FIG. 2D is patterned by patterning techniques, such as reactive ion etch (RIE) methods, to thereby define in the multilayered inorganic/organic insulator film structure a plurality of openings 44, also known as via holes or trench in the semiconductor device art. Thereafter, metalization is done to bury in the via holes 44 electrical interconnect conductors 14, followed by planarization where necessary, thus providing the multilayer wiring structure 10 shown in FIG. 1.

One example of the organic low-dielectric constant film 18 usable in this embodiment is a fluorinated aromatic-series carbon hydride polymeric film, because this polymer film has an ultra-low dielectric constant. Preferably, this fluorinated aromatic carbon hydride polymer film is implemented as a polymerized film of fluorinated polydialkylbenzene, fluorinated polyfluorodialkylzebenzene or equivalents thereto. To be more specific, currently available examples of the material include, but not limited to, fluorinated polyxylylene-$[CF_2—C_6H_4—CF_2]_n$—, fluorinated polyfluoroxylylene-$[CF_2—C_6F_4—CF_2]_n$—, fluorinated polydiethylbenzene, fluorinated polyfluorodiethylbenzene, fluorinated polymethylethylbenzene, and fluorinated polyfluoromethylethylbenzene.

Exemplary raw materials suitable for the manufacture of such the fluorinated aromatic carbon hydride polymer film may be fluorinated xylylene bromide $[CF_2Br—C_6H_4—CF_2Br]$, fluorinated fluoroxylylene bromide $[CF_2Br—C_6F_4—CF_2Br]$ or equivalents thereof.

These fluorinated aromatic carbon hydride polymer films are manufacturable by a process which includes the steps of heating a fluorinated aromatic carbon hydride gas for use as a raw material up to a high temperature, activating the raw material gas to thereby form a precursor of polymer, and thereafter causing this precursor to react on or above the substrate being processed.

The chemical reaction for shift conversion or "transformation" of the above-noted raw material into the precursor may be effectuated by heating it at temperatures of about 500 to 800° C. for 1 to 100 seconds. Also note that the transformation of the fluorinated aromatic carbon hydride polymer film of the precursor thus created is carried out in the CVD equipment while letting the precursor undergo both condensation and polymerization on the substrate at a time, under the conditions which follow: the flow rate of the precursor is set at 1 to 10 sccm; the pressure for film formation is at 1.3 to 6.7 Pa (i.e., 10 to 50 mTorr); temperature is within a range of from −50 to 0° C.; and, a time required therefor ranges from 1 to 10 minutes.

By fabricating semiconductor IC devices such as ULSI chips using the process stated above, it is possible to force the surface of the inorganic underlayer film 16 to have its water contact angle which falls within a prespecified range. This makes it possible to improve the adhesion of the inorganic underlayer film 16 with respect to the fluorinated aroma-series carbon hydride polymer film 18 to be formed on the surface thereof. Thus it becomes possible to preclude or at least greatly suppress unwanted occurrence of defects during manufacturing processes, such as film peel-off or the like.

A semiconductor device fabrication method in accordance with another embodiment of the invention will be discussed with reference to FIGS. 4A to 4E below. Although in the above-noted embodiment one specific method is shown for using a starting substrate 12 with an inorganic underlayer film 16 to perform the process for causing its surface to exhibit hydrophobicity—say, hydrophobicization—to thereby improve the adhesion between the inorganic underlayer film 16 and its overlying organic low-dielectric constant film 18, the embodiment shown in FIGS. 4A–4E is a method capable of performing the process steps consecutively or "seamlessly" by using the same plasma processing equipment 24 shown in FIG. 3. To this end, the method includes the steps of forming the inorganic underlayer film 16 by CVD techniques, and subsequently continuing execution of the plasma-assisted CVD processing at its surface in gaseous environment of a chosen organic silane compound to thereby allow the film surface to exhibit hydrophobicity.

Figure 4A:
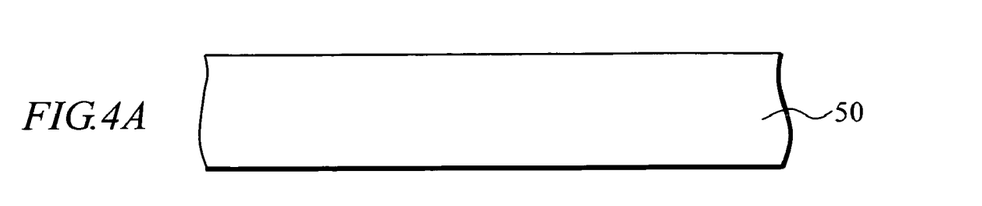
FIGS. 4A to 4E illustrate, in cross-section, some major process steps in the fabrication of a semiconductor IC device in accordance with another embodiment of the invention.

First, as shown in FIG. 4A, a substrate 50 is prepared. Examples of this substrate 50 are a silicon substrate, ceramic substrate, glass substrate, plastics substrate, and flexible substrate or equivalents thereto. Alternatively, there may also be employable those substrates with more than one of various kinds of functional films formed on these substrates. Examples of such function films are electrically insulative films, electrode films, dielectric material films or the like.

Figure 4B:
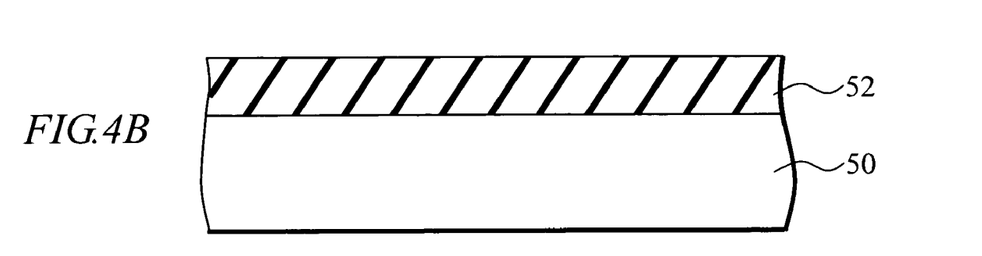

Then, as shown in FIG. 4B, use a plasma-assisted CVD method to form on a top surface of the substrate 50 an underlying inorganic film 52 for later use as the underlayer or "undercoat" film required. Preferably, an inorganic material with a low dielectric constant is employed for use as this film material. As an example only, a film made of SiCN, SiC, SiOC, BN or $SiO_2$ is usable therefor. Preferably, this film 16a may be a film fabricated by plasma-assisted CVD methods. Also preferably, the film 16a is made of certain material that can be formed into a film by using an organic silane-based compound as its raw material. This can be said because the use of such material makes it possible to seamlessly perform fabrication of such inorganic underlayer film 16a and a hydrophobic surface layer formed on its surface by using the same plasma processor equipment, without any appreciable process interruption.

Practically, while a silicon cyanide (SiCN) film is manufacturable by performing plasma processing in environment with an admixture of trimethylsilane and ammonia gases, it is possible to fabricate the intended hydrophobic layer above the target substrate 50 by the process having the steps of forming the SiCN film and thereafter subsequently performing plasma processing using trimethylsilane only, as shown in FIG. 4B.

Figure 4C:
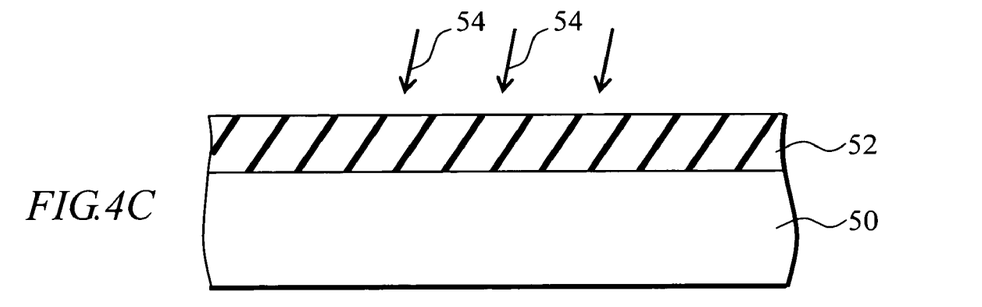

Then, as shown by arrows 54 in FIG. 4C, apply plasma processing to a top surface of the inorganic underlayer film 52 that was formed by plasma-assisted CVD processing in a gaseous atmosphere that contains therein organic silane-based compounds in a similar way to that at the process step shown in FIG. 2B in the embodiment stated supra. By this plasma processing, the top surface of inorganic underlayer film 52 is changed in quality, thereby forming a hydrophobic surface 56 as shown in FIG. 4D.

Figure 4D:
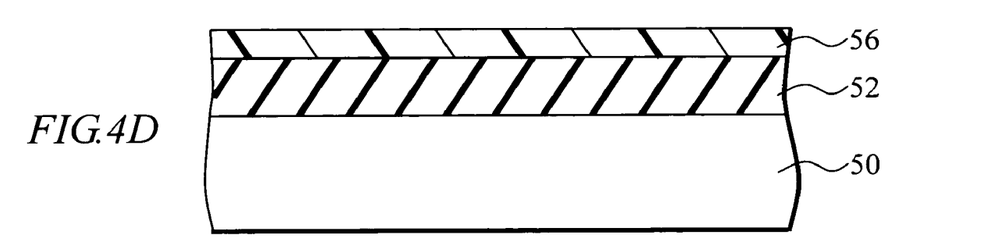
Figure 4E:
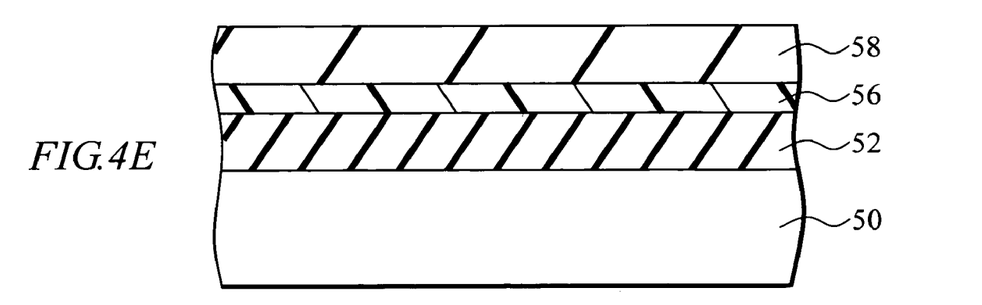

Next, as shown in FIG. 4E, a similar method to the one stated previously in the previous embodiment is used to form an organic low-dielectric constant film 58 on the hydrophobic surface 56 thus formed at the step of FIG. 4D. The following process procedure is similar to that discussed in the previous embodiment; thus, a repetitive explanation will be eliminated herein.

In the method shown in FIGS. 4A–4E, it is possible to consecutively form several stacked layers including the inorganic underlayer film 52 up to the organic low-dielectric constant film 58 that make up the intended multilayer structure while offering "seamless" process continuing capabilities in the plasma CVD processor equipment 24 shown in FIG. 3. Thus it is possible to efficiently fabricate semiconductor IC devices.

Although in the above-stated embodiments specific examples are shown for fabricating the intended multilayer wiring structure 10 by hydrophobicizing the surface of an inorganic underlayer film 16, 52 through plasma processing of it in the organic silicon-based compound-containing gaseous atmosphere and then forming on the surface an organic low-dielectric constant film 18, 58, the scheme of this invention may also be applicable to the manufacture of other electronic devices having a structure for forming an inorganic film(s) on or above a certain kind of substrate—such as a semiconductor substrate, metallic substrate, ceramics material substrate, glass substrate, plastics substrate or else—and then forming on its surface an organic polymer film(s).

More specifically, the techniques of the embodiments as disclosed herein are also applicable not only to high-density IC or ULSI devices having organic interlayer dielectric (ILD) material layers with low dielectric constants, but also to magnetic record/playback or "read/write" head structures having a similar organic low-dielectric constant film(s) for processing RF signals, as well as thin-film electronics circuit elements with organic thin-film dielectric material layers.

Although in the illustrative embodiments stated supra, there are sequentially employed the process steps of changing in quality the surface of an inorganic film (16, 52) to exhibit hydrophobicity through plasma CVD processing in the organic silicon compound-containing environment and then forming a fluorinated aromatic carbon hydride polymer film (18, 58), it is also possible to make use of a method for executing hydrophobicization of the fluorinated aromatic carbon hydride polymer film and thereafter forming the inorganic film required. These processes may be implemented by plasma CVD equipment in a continuous or "seamless" fashion with no appreciable process interruption.

EXAMPLE 1

There is shown below an example of the fabrication method of an electronic device having a multilayer structure of an SiOC thin-film and a fluorinated aromatic carbon hydride polymer film that is formed on a surface of the SiOC thin-film. In this example, the plasma processor equipment 24 shown in FIG. 3 is used to fabricate a semiconductor IC device by the process shown in FIGS. 4A–4E.

First, an SiOC film was formed on a substrate 50 using a plasma-assisted CVD method, thereby providing an inorganic underlayer film 52 (see FIG. 4B).

Then, use the same plasma CVD equipment 24 which was used for the SiOC formation process step to perform plasma processing using a gas that contains tetramethylsilane as the organic silane, under the conditions as will be set forth below. Next, a thin-film layer was formed on a top surface of the SiOC film. This layer is in the state that an organic group comprised of methyl groups is left to have a thickness of about 2 nanometers (nm).

The film formation conditions used herein are as follows:
Pressure in Film-Forming Chamber: 233 Pa (1.75 Torr)
Temperature: 400° C.
Raw Material Gas: Tetramethylsilane Raw Gas Flow Rate: 2500 sccm
RF Power Supply Frequency: 13.56 MHz
Power: 100 to 800 W Regarding the SiOC film thus formed by this method, measurement was done to ascertain the contact angle of its surface with respect to water.

Next, a fluorinated aromatic carbon hydride polymer film was formed under the conditions as will be presented later.

More specifically, the plasma CVD equipment 24 shown in FIG. 3 was used to perform activation by the hot reactor mechanism 34 with its inner wall temperature of about 600° C. while at the same time causing the flow rate control valve 28a to control the flow of a raw material gas from the raw material container 26a which was heated for vaporization, thereby forming a precursor used for fabrication of a thin-film through polymerization reaction. This precursor was introduced onto a substrate as mounted on an electrostatic chuck, which is disposed within the film-forming chamber 36 and which has its temperature being controlled to stay at 30° C. Then, a fluorinated polyxylylene-$[CF_2—C_6H_4—CF_2]_n$— was formed for use as the intended organic thin-film, under the following plasma processing conditions (see FIG. 4E).

Precursor Flow Rate: 5 sccm

Film Formation Pressure: 2.7 Pa (20 mTorr)

Figure 5:
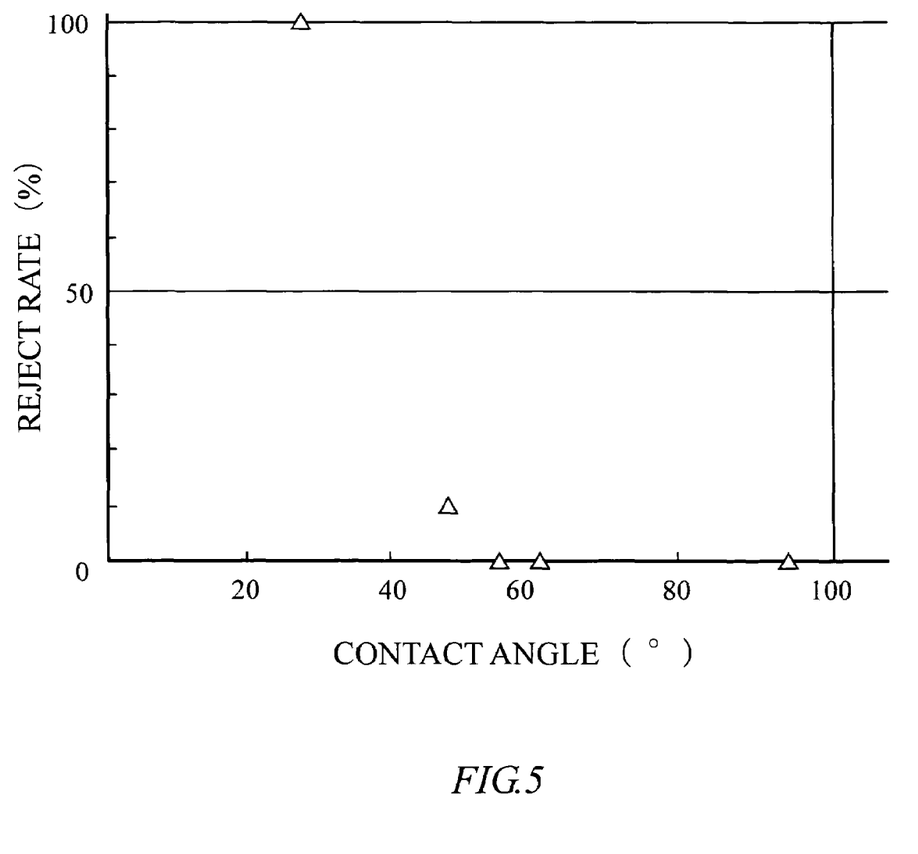
FIG. 5 is a graph showing experimental data of actually reduced examples of the invention along with data of an example for the comparison use.

After having formed a multilayer structure of the inorganic underlayer film 52 and the organic low-dielectric constant film 58 thus formed by the above-noted method, the resultant adhesion was evaluated by tape testing procedures. To be more specific, a cutter tool was used to scar a surface of this multilayer structure for square markings or "dicing" purposes in such a way that the surface area is divided into a hundred of "tiles" equal in size—say, chips. In this example the multilayer surface was 1 square centimeter ($cm^2$) in area, and each chip has its area of 1 square millimeter ($mm_2$). Thereafter, an adhesive tape was applied onto the surface of the organic low-dielectric constant film. Then, peel this tape off from the film surface, followed by counting up of an exact number of peeled chips that are attached to the adhesive tape. This count number was used for adhesion comparison. The result of this peeling test is shown in a graph of FIG. 5. In this graph, a ratio of the number of peeled chips with respect to a total chip number defines the defect rate in percent, also called reject rate. As apparent from FIG. 5, it has been demonstrated that the reject rate became zero when the contact angle is almost at 50° or greater.

Besides the above-mentioned method, the same hydrophobic surface can be obtained by coating with silane-coupling agent on the surface of the inorganic layer, and by plasma-processing on the surface of the inorganic layer in Ar gas and sequentially laying in an organic silane compound atmosphere, and so on.

COMPARATIVE EXAMPLE

Next, in order to affirm the effects of the previous example, experimentation for comparison purposes was done in a way which follows. In Example 1 stated above, after having formed the inorganic underlayer film on the substrate surface, an oxide film was fabricated on this substrate surface by a plasma CVD method using an oxidizable gas such as $O_2$ and $N_2O$ gases or the like as an alternative to the CVD processing applied to the substrate in the organic silicon compound-containing environment. Thereafter, a similar method to that in Example 1 was used to form a fluorinated aromatic carbon hydride polymer film. The result of it is that the adhesion between the inorganic underlayer film and the fluorinated aromatic carbon hydride polymer film that was formed thereon was inferior. Thus, no sufficiently practical results were obtained in an adhesive tape peeling test similar to that of the Example 1 stated supra.

EXAMPLE 2

Another example of the electronic device fabrication method is shown below. This method is the one that forms an SiCN film for use as the underlayer film by plasma CVD techniques and then forms on its surface a polyfluoroxylylene film.

In this example also, the plasma CVD equipment 24 of FIG. 3 was used. A silicon wafer substrate was placed within the film-forming chamber 36. With the use of trimethylsilane and ammonia gases as raw material gases, an SiCN film was formed by plasma CVD on a surface of the silicon substrate. At the final step of the plasma CVD process, the feeding of the ammonia was interrupted; alternatively, only the trimethylsilane and nitrogen gases are supplied thereto. Then, a surface having methyl groups was formed while suppressing decomposition of the trimethylsilane by gradually lessening an RF output at a power drop rate of 100 to 500 watts per second (W/sec), rather than by forcing it to steeply fall down at 0 W.

Next, on the surface that was processed using trimethylsilane, a fluorinated polyxylylene film was formed as the fluorinated aromatic carbon hydride polymer film under substantially the same conditions as those in Example 1 stated previously. As for the resultant multilayer structure of the SiCN film and the fluorinated polyxylylene film, adhesion evaluation was carried out by means of the adhesive tape testing similar to that of Example 1.

The result is that the reject rate of film peel-off became zero under the condition that the contact angle is set at about 50° C. or greater.

While the invention has been disclosed and illustrated with reference to particular embodiments, the principles involved are susceptible for use in numerous other embodiments, modification and alterations which will be apparent to persons skilled in the art to which the invention pertains. The invention is, therefore, to be limited only as indicated by the scope of the appended claims.

Although in the above examples the underlying inorganic film acting as the underlayer film was implemented as SiOC and SiCN films, the principal concept of this invention may also be applicable to those films made of other dielectric materials including, but not limited to, SiC, SiN, $SiO_2$, and SiON.

It is also noted that the principles of the invention are also applicable to various types of processes capable of lamination or "multilayer" of thin-films using fluorinated polyxylylene-$[CF_2—C_6H_4—CF_2]_n$— films, fluorinated organic films such as fluorinated ethylene films, and organic polymer films.

What is claimed is:

1. A method for making an electronic device, said method comprising the steps of:
    applying plasma processing to a surface of an inorganic film in an environment containing therein an organic silane-based chemical compound to thereby form at the inorganic film surface a hydrophobic surface with a contact angle with water being 50 degrees (°) or greater; and
    forming at the plasma-processed surface a fluorinated aromatic carbon hydride polymeric film.

2. The method of claim 1 wherein said plasma-processed surface is more than or equal to 60° in contact angle with water.

3. The method of claim 1 wherein said inorganic film is made of a material as selected from the group consisting of silicon dioxide (SiO$_2$), silicon nitride (SiN), silicon carbide (SiC), carbon-incorporated silicon oxide (SiOC) and silicon carbon nitride (SiCN).

4. The method of claim 1 wherein said inorganic film is formed by a plasma-assisted chemical vapor deposition (CVD) technique.

5. The method of claim 1 wherein said polymeric film is made of any one of polyxylylene fluoride and polyfluroxylylene fluoride.

6. The method of claim 1 wherein said step of forming a polymer film includes:
heating a fluorinated aromatic carbon hydride gas to form a precursor of polymer; and
causing said precursor to react at the surface of a substrate being processed.

7. The method of claim 1 wherein said compound is at least one as selected from the group consisting of tetramethylsilane, trimethylsilane, dimethylsilane, tetraethylsilane and tetraethoxysilane.

8. The method of claim 7 wherein the environment containing said compound is any one of an atmosphere comprised of organic silane-based compound alone and an atmosphere diluted using a diluent gas.

9. The method of claim 8 wherein said compound in said environment has a content ranging from 10 to 100 volume percent (%).

10. A method of fabricating an electronic device, comprising the steps of:
forming an inorganic film at a substrate surface by use of plasma-assisted CVD processing apparatus;
subsequently applying, within said apparatus, plasma processing to a surface of said inorganic film in an atmosphere containing an organic silane-based chemical compound to thereby form a hydrophobic surface with its contact angle with water being 50° or more; and
forming on the plasma-processed surface a fluorinated aromatic carbon hydride polymer film.

11. The method of claim 10 wherein said inorganic film is made of a material as selected from the group consisting of SiO$_2$, SiN, SiC, SiOC and SiCN.

12. The method of claim 10 wherein said polymer film is made of any one of polyxylylene fluoride and polyfluroxylylene fluoride.

13. The method of claim 10 wherein said step of forming a polymer film includes:
heating a fluorinated aromatic carbon hydride gas to form a precursor of polymer; and
causing said precursor to react at the surface of a substrate being processed.

14. The method of claim 10 wherein said compound is at least one as selected from the group consisting of tetramethylsilane, trimethylsilane, dimethylsilane, tetraethylsilane and tetraethoxysilane.

15. The method of claim 14 wherein the atmosphere containing said compound is any one of an atmosphere comprised of organic silane-based compound alone and an atmosphere diluted using a diluent gas.

16. The method of claim 14 wherein said compound in said atmosphere has a content ranging from 10 to 100 volume %.

17. A method for manufacturing a semiconductor device, comprising:
supplying a gas containing therein an organic silane-based compound and a nitrogen compound to a substrate surface being disposed within a plasma processing apparatus;
performing plasma processing to thereby form an inorganic film on or above said substrate surface;
continuing said plasma processing by stopping supplement of said nitrogen compound while retaining said plasma processing and supplying only said organic silane-based compound to said plasma processing apparatus;
causing a surface of an inorganic film thus formed in said step to exhibit hydrophobicity; and
forming on a resultant hydrophobic surface a fluorinated aromatic carbon hydride polymer film.

18. The method of claim 17 wherein said nitrogen compound includes ammonia.

19. The method of claim 18 wherein said inorganic film includes an SiCN film.

20. A dielectric film multilayer structure used for electrical interconnect wiring in an electronic device including a semiconductor integrated circuit device, said structure comprising:
a substrate having a surface;
a first insulative film on or above the surface of said substrate, the first film having a hydrophobic surface with a contact angle with water being more than or equal to 60° and including an inorganic film with a top surface as plasma-processed to have hydrophobicity; and
a second insulative film above the hydrophobic surface of said first film and including an organic polymer film made of any one of polyxylylene fluoride and polyfluxoxylylene fluoride with a decreased dielectric constant.

21. The structure of claim 20 wherein said polymer film has its dielectric constant ranging from about 2.0 to about 2.4.

22. The structure of claim 20 wherein said inorganic film is made of a material as selected from the group consisting of SiO$_2$, SiN, SiC, SiOC and silicon carbon nitride SiCN.

23. The structure of claim 20 wherein said inorganic film is a plasma-assisted chemical vapor deposited film.

24. The structure of claim 20 further comprising:
an electrical wiring conductor as buried in at least one opening in the first and second insulative films.

* * * * *